US009411987B2

(12) United States Patent
Alladi et al.

(10) Patent No.: US 9,411,987 B2
(45) Date of Patent: Aug. 9, 2016

(54) LOW NOISE AND LOW POWER PASSIVE SAMPLING NETWORK FOR A SWITCHED-CAPACITOR ADC WITH A SLOW REFERENCE GENERATOR

(71) Applicant: QUALCOMM Incorporated, San Diego, CA (US)

(72) Inventors: Dinesh Jagannath Alladi, San Diego, CA (US); Yuhua Guo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/826,928

(22) Filed: Aug. 14, 2015

(65) Prior Publication Data
US 2016/0048707 A1 Feb. 18, 2016

Related U.S. Application Data

(60) Provisional application No. 62/038,504, filed on Aug. 18, 2014.

(51) Int. Cl.
H03M 3/00 (2006.01)
G06G 7/186 (2006.01)

(52) U.S. Cl.
CPC ............ G06G 7/186 (2013.01); G06G 7/1865 (2013.01); H03M 3/32 (2013.01); H03M 3/344 (2013.01); H03M 3/50 (2013.01); H03M 3/342 (2013.01); H03M 3/496 (2013.01)

(58) Field of Classification Search
CPC .......... H03M 1/00; H03M 1/66; H03M 7/186
USPC .................. 341/143, 144, 155, 122, 163, 172
See application file for complete search history.

(56) References Cited

U.S. PATENT DOCUMENTS 6,384,758 B1 * 5/2002 Michalski ............ G11C 27/026
327/94
7,009,549 B1 3/2006 Corsi
7,038,532 B1 5/2006 Bocko et al.
(Continued)

FOREIGN PATENT DOCUMENTS

EP 1755226 A3 5/2007

OTHER PUBLICATIONS

Berglund K., et al., "On the Realization of Switched-Capacitor Integrators for Sigma-Delta Modulators," 2007, 118 pages.
Kim M.G., et al., "A 0.9 V 92 dB Double-Sampled Switched-RC Delta-Sigma Audio ADC," IEEE Journal of Solid-State Circuits, May 2008, vol. 43 (5), pp. 1195-1206.
Kwak Y.S., et al., "A 1.8 V 89.2 dB Delta-Sigma ADC for Sensor Interface with On-Chip Reference," IEEE International Symposium on Circuits and Systems (ISCAS), 2012, pp. 520-523.
International Search Report and Written Opinion—PCT/US2015/045426—ISA/EPO—Nov. 23, 2015.

Primary Examiner — Peguy Jean Pierre
(74) Attorney, Agent, or Firm — Patterson & Sheridan, L.L.P.

(57) ABSTRACT

Certain aspects of the present disclosure provide various sampling networks for switched-capacitor integrators, which may be used in switched-capacitor analog-to-digital converters (ADCs). Rather than having both an input sampling capacitor and a reference sampling capacitor, certain aspects of the present disclosure use a shared sampling capacitor for the reference voltage and the input voltage, thereby reducing ADC input-referred noise, decreasing op amp area and power, and avoiding anti-aliasing filter insertion loss. Furthermore, by sampling the reference voltage during the sampling phase and sampling the input voltage during the integration phase using the shared sampling capacitor, a high-bandwidth reference buffer need not be used for the reference voltage.

31 Claims, 11 Drawing Sheets

(56) References Cited

U.S. PATENT DOCUMENTS

| | | |
|---|---|---|
| 7,142,143 B2 | 11/2006 | Draxelmayr |
| 7,339,512 B2 | 3/2008 | Gulati et al. |
| 7,994,958 B2 | 8/2011 | Quiquempoix et al. |
| 9,124,290 B2* | 9/2015 | Sherry .................. H03M 3/322 |
| 2006/0082481 A1 | 4/2006 | Oprescu |
| 2010/0201555 A1* | 8/2010 | Karavidas ............. H03M 1/403 341/143 |
| 2010/0219864 A1* | 9/2010 | Farhat .................. G11C 27/026 327/96 |
| 2013/0050002 A1* | 2/2013 | Watanabe ............ G11C 27/026 341/122 |
| 2013/0278454 A1 | 10/2013 | Schmid et al. |
| 2015/0102951 A1* | 4/2015 | Watanabe ............. H03M 3/374 341/143 |
| 2015/0222238 A1* | 8/2015 | Lee ........................ H03G 3/008 341/159 |

* cited by examiner

LOW NOISE AND LOW POWER PASSIVE SAMPLING NETWORK FOR A SWITCHED-CAPACITOR ADC WITH A SLOW REFERENCE GENERATOR

CROSS-REFERENCE TO RELATED APPLICATIONS

This application claims benefit of U.S. Provisional Patent Application Ser. No. 62/038,504, filed Aug. 18, 2014 and entitled "LOW NOISE AND LOW POWER PASSIVE SAMPLING NETWORK FOR A SWITCHED-CAPACITOR ADC WITH A SLOW REFERENCE GENERATOR," which is herein incorporated by reference in its entirety.

TECHNICAL FIELD

Certain aspects of the present disclosure generally relate to electronic circuits and, more particularly, to a sampling network for a switched-capacitor analog-to-digital converter (ADC).

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to a sampling network for a switched-capacitor integrator, which may be used in a switched-capacitor analog-to-digital converter (ADC). Rather than having both an input sampling capacitor and a reference sampling capacitor, certain sampling networks disclosed herein use a single sampling capacitor and connect the input voltage to this same capacitor during input sampling, thereby reducing ADC input-referred noise, decreasing op amp area and power, and avoiding anti-aliasing filter insertion loss.

Certain aspects of the present disclosure provide a switched-capacitor integrator. The integrator generally includes an amplifier having first and second output nodes and first and second input nodes; a first integration capacitor coupled between the first output node and the first input node; a second integration capacitor coupled between the second output node and the second input node; first and second sampling capacitors, each having a first terminal and a second terminal; a first set of switches configured to connect reference voltage nodes (e.g., with a reference voltage applied across these nodes) with the first terminals of the first and second sampling capacitors during a sampling phase of the integrator; and a second set of switches configured, during an integration phase of the integrator, to connect: (1) input voltage nodes (e.g., with an input voltage applied across these nodes) with the first terminals of the first and second sampling capacitors; and (2) the first and second input nodes of the amplifier with the second terminals of the first and second sampling capacitors, wherein the first set of switches is open during the integration phase and wherein the second set of switches is open during the sampling phase.

According to certain aspects, the integrator further includes an anti-aliasing filter connected between the input voltage nodes and a portion of the second set of switches (e.g., the members of the second set of switches configured to connect the input voltage nodes with the first terminals of the first and second sampling capacitors, but not the members of the second set of switches configured to connect the first and second input nodes of the amplifier with the second terminals of the first and second sampling capacitors). For certain aspects, a filter capacitor of the anti-aliasing filter has a substantially larger capacitance than the first sampling capacitor and the second sampling capacitor. For certain aspects, the integrator further includes first and second sampling networks connected between the anti-aliasing filter and the portion of the second set of switches. Each of the first and second sampling networks generally includes an input capacitor having first and second terminals; a third set of switches configured to selectively connect an input node of the sampling network with the first terminal of the input capacitor; and a fourth set of switches configured to connect an output node of the sampling network with the second terminal of the input capacitor during the integration phases.

According to certain aspects, the integrator further includes a third set of switches configured to short at least one of the first or second sampling capacitor between the integration phase and the sampling phase.

According to certain aspects, the reference voltage nodes include a positive reference voltage node and a negative reference voltage node, and the input voltage nodes include a positive input voltage node and a negative input voltage node. For certain aspects, the first set of switches is configured to connect: (1) the positive reference voltage node with the first terminal of the first sampling capacitor; and (2) the negative reference voltage node with the first terminal of the second sampling capacitor. In this case, the first set of switches may be configured to connect the second terminal of the first sampling capacitor with the second terminal of the second sampling capacitor or to connect the second terminals of the first and second sampling capacitors to a voltage level (e.g., an electrical ground or a DC bias voltage). In a first configuration, the second set of switches may be configured to connect: (1) the positive input voltage node with the first terminal of the first sampling capacitor; (2) the negative input voltage node with the first terminal of the second sampling capacitor; (3) the first input node of the amplifier with the second terminal of the first sampling capacitor; and (4) the second input node of the amplifier with the second terminal of the second sampling capacitor. In a second configuration, the second set of switches may be configured to connect: (1) the positive input voltage node with the first terminal of the second sampling capacitor; the negative input voltage node with the first terminal of the first sampling capacitor; the first input node of the amplifier with the second terminal of the second sampling capacitor; and the second input node of the amplifier with the second terminal of the first sampling capacitor. For certain aspects, selection between the first and second configurations is controlled by a digital input to a digital-to-analog converter (DAC) in a delta-sigma modulator comprising the integrator. For certain aspects, the first configuration is selected if a control bit for the second set of switches has a first logic level, and the second configuration is selected if the control bit has a second logic level opposite the first logic level (e.g., the first logic level is logic high and the second logic level is logic low).

According to certain aspects, the first set of switches is further configured to short the second terminals of the first and second sampling capacitors together during the sampling phase.

According to certain aspects, the first and second sampling capacitors and the second set of switches are part of a DAC element having its own control bit. In this case, the integrator may further include one or more additional DAC elements replicating the DAC element, each of the additional DAC elements having a control bit and connected in parallel with the DAC element.

Certain aspects of the present disclosure provide a switched-capacitor integrator. The switched-capacitor integrator generally includes an amplifier comprising an output node and an input node; an integration capacitor coupled between the output node and the input node of the amplifier; a sampling capacitor having a first terminal and a second terminal; a first set of switches configured to connect a reference voltage node with the first terminal of the sampling capacitor during a sampling phase of the integrator; and a second set of switches configured, during an integration phase of the integrator, to connect: (1) an input voltage node with the first terminal of the sampling capacitor in a first configuration; (2) the input voltage node with the second terminal of the sampling capacitor in a second configuration; (3) the input node of the amplifier with the second terminal of the sampling capacitor in the first configuration; and (4) the input node of the amplifier with the first terminal of the sampling capacitor in the second configuration. The first set of switches is open during the integration phase, and the second set of switches is open during the sampling phase.

According to certain aspects, the first configuration is selected if a control bit has a first logic level, and the second configuration is selected if the control bit has a second logic level opposite the first logic level. For example, the first logic level may be logic high, and the second logic level may be logic low.

According to certain aspects, the integrator further includes an anti-aliasing filter connected between the input voltage node and a portion of the second set of switches (e.g., the members of the second set of switches configured to connect the input voltage node with the first (second) terminal of the sampling capacitor in the first (second) configuration, but not the members of the second set of switches configured to connect the input node of the amplifier with the second (first) terminal of the sampling capacitor in the first (second) configuration). For certain aspects, a filter capacitor of the anti-aliasing filter has a substantially larger capacitance than the sampling capacitor.

According to certain aspects, the first set of switches is configured to connect the second terminal of the sampling capacitor with a voltage level (e.g., an electrical ground or a DC bias voltage) during the sampling phase. For certain aspects, the input node comprises a negative terminal of the amplifier, and a positive terminal of the amplifier is connected with the voltage level.

According to certain aspects, the integrator further includes a switch configured to short the sampling capacitor between the integration phase and the sampling phase.

According to certain aspects, selection between the first and second configurations is controlled by a digital input to a DAC in a delta-sigma modulator comprising the integrator.

According to certain aspects, the sampling capacitor and the second set of switches are part of a DAC element having its own control bit. In this case, the integrator may further include one or more additional DAC elements replicating the DAC element, each of the additional DAC elements having its own control bit and connected in parallel with the DAC element.

Certain aspects of the present disclosure provide a switched-capacitor integrator. The integrator generally includes an amplifier having first and second output nodes and first and second input nodes; a first integration capacitor coupled between the first output node and the first input node; a second integration capacitor coupled between the second output node and the second input node; first and second sampling capacitors, each having a first terminal and a second terminal; a first set of switches configured to connect reference voltage nodes with the first terminals of the first and second sampling capacitors during reference sampling phases of the integrator; and a second set of switches. The second set of switches is typically configured, during integration phases of the integrator, to connect: (1) the second terminals of the first and second sampling capacitors with the first and second input nodes of the amplifier; and (2) the first terminals of the first and second sampling capacitors with outputs of first and second sampling networks, wherein the first set of switches is open during the integration phases and wherein the second set of switches is open during the reference sampling phases. Each of the first and second sampling networks generally includes a first input capacitor having first and second terminals; a second input capacitor having first and second terminals; a third set of switches configured to selectively connect an input node of the sampling network with the first terminal of the first input capacitor; a fourth set of switches configured to connect an output node of the sampling network with the second terminal of the second input capacitor during a first set of the integration phases; a fifth set of switches configured to selectively connect the input node of the sampling network with the first terminal of the second input capacitor; and a sixth set of switches configured to connect the output node of the sampling network with the second terminal of the first input capacitor during a second set of the integration phases.

According to certain aspects, the first set of the integration phases comprises every other one of the integration phases. For example, the first set of the integration phases includes odd integration phases, whereas the second set of the integration phases includes even integration phases. For certain aspects, the reference sampling phases overlap neither the first nor the second set of the integration phases.

According to certain aspects, the third set of switches is configured to connect the input node of the sampling network with the first terminal of the first input capacitor during the first set of the integration phases. For certain aspects, the fifth set of switches is configured to connect the input node of the sampling network with the first terminal of the second input capacitor during the second set of the integration phases.

According to certain aspects, the third set of switches is further configured to selectively connect (e.g., before, during, or after the first set of the integration phases) the second terminal of the first input capacitor to a first voltage level (e.g., an electrical ground or a DC bias voltage), and the fourth set of switches is further configured to selectively connect (e.g., during the first set of the integration phases) the first terminal of the second input capacitor to a second voltage level. For certain aspects, the first and second voltage levels are the same. For certain aspects, during the second set of the integration phases, the fifth set of switches is further configured to selectively connect (e.g., before, during, or after the second set of the integration phases) the second terminal of the second input capacitor to the first voltage level, and the sixth set of switches is further configured to selectively connect (e.g., during the second set of the integration phases) the first terminal of the first input capacitor to the second voltage level.

According to certain aspects, during the integration phases, the first sampling capacitor is effectively connected in series with the first or the second input capacitor in the first sampling network. The second sampling capacitor may be effectively connected in series with the first or the second input capacitor in the second sampling network.

According to certain aspects, the third and fourth sets of switches are open during the second set of the integration phases. The fifth and sixth sets of switches may be open during the first set of the integration phases. For certain aspects, the third, fourth, fifth, and sixth sets of switches are open during the reference sampling phases. For other aspects, the third set of switches is closed, and the sixth set of switches is open, during a first set of input sampling phases. In this case, the fifth set of switches may be closed, and the fourth set of switches may be open, during a second set of the input sampling phases, which is different from the first set of the input sampling phases (e.g., the first and second sets of the input sampling phases do not overlap). For certain aspects, the first set of the input sampling phases may be every other one of the sampling phases (e.g., the first set of the input sampling phases includes odd input sampling phases, whereas the second set of the input sampling phases includes even input sampling phases).

According to certain aspects, the integrator further includes an anti-aliasing filter connected between input voltage nodes (e.g., with an input voltage applied across these nodes) and the input nodes of the first and second sampling networks.

According to certain aspects, the reference voltage nodes comprise a positive reference voltage node and a negative reference voltage node. For certain aspects, the first set of switches is configured to connect: (1) the positive reference voltage node with the first terminal of the first sampling capacitor; and (2) the negative reference voltage node with the first terminal of the second sampling capacitor. In this case, the first set of switches may be configured to connect the second terminal of the first sampling capacitor with the second terminal of the second sampling capacitor or to connect the second terminals of the first and second sampling capacitors to a voltage level (e.g., an electrical ground or a DC bias voltage). In a first configuration, the second set of switches may be configured to connect: (1) the output node of the first sampling network with the first terminal of the first sampling capacitor; (2) the output node of the second sampling network with the first terminal of the second sampling capacitor; (3) the first input node of the amplifier with the second terminal of the first sampling capacitor; and (4) the second input node of the amplifier with the second terminal of the second sampling capacitor. In a second configuration, the second set of switches may be configured to connect: (1) the output node of the first sampling network with the first terminal of the second sampling capacitor; (2) the output node of the second sampling network with the first terminal of the first sampling capacitor; (3) the first input node of the amplifier with the second terminal of the second sampling capacitor; and (4) the second input node of the amplifier with the second terminal of the first sampling capacitor. For certain aspects, selection between the first and second configurations is controlled by a digital input to a DAC in a delta-sigma modulator comprising the integrator.

Certain aspects of the present disclosure provide a switched-capacitor integrator. The integrator generally includes an amplifier having first and second output nodes and first and second input nodes; a first integration capacitor coupled between the first output node and the first input node; a second integration capacitor coupled between the second output node and the second input node; first and second sampling capacitors, each having a first terminal and a second terminal; a first set of switches configured to connect reference voltage nodes with the first terminals of the first and second sampling capacitors during reference sampling phases of the integrator; and a second set of switches. The second set of switches is typically configured, during integration phases of the integrator, to connect: (1) the second terminals of the first and second sampling capacitors with the first and second input nodes of the amplifier; and (2) the first terminals of the first and second sampling capacitors with outputs of first and second sampling networks, wherein the first set of switches is open during the integration phases and wherein the second set of switches is open during the reference sampling phases. Each of the first and second sampling networks generally includes an input capacitor having first and second terminals; a third set of switches configured to selectively connect an input node of the sampling network with the first terminal of the input capacitor; and a fourth set of switches configured to connect an output node of the sampling network with the second terminal of the input capacitor during the integration phases.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
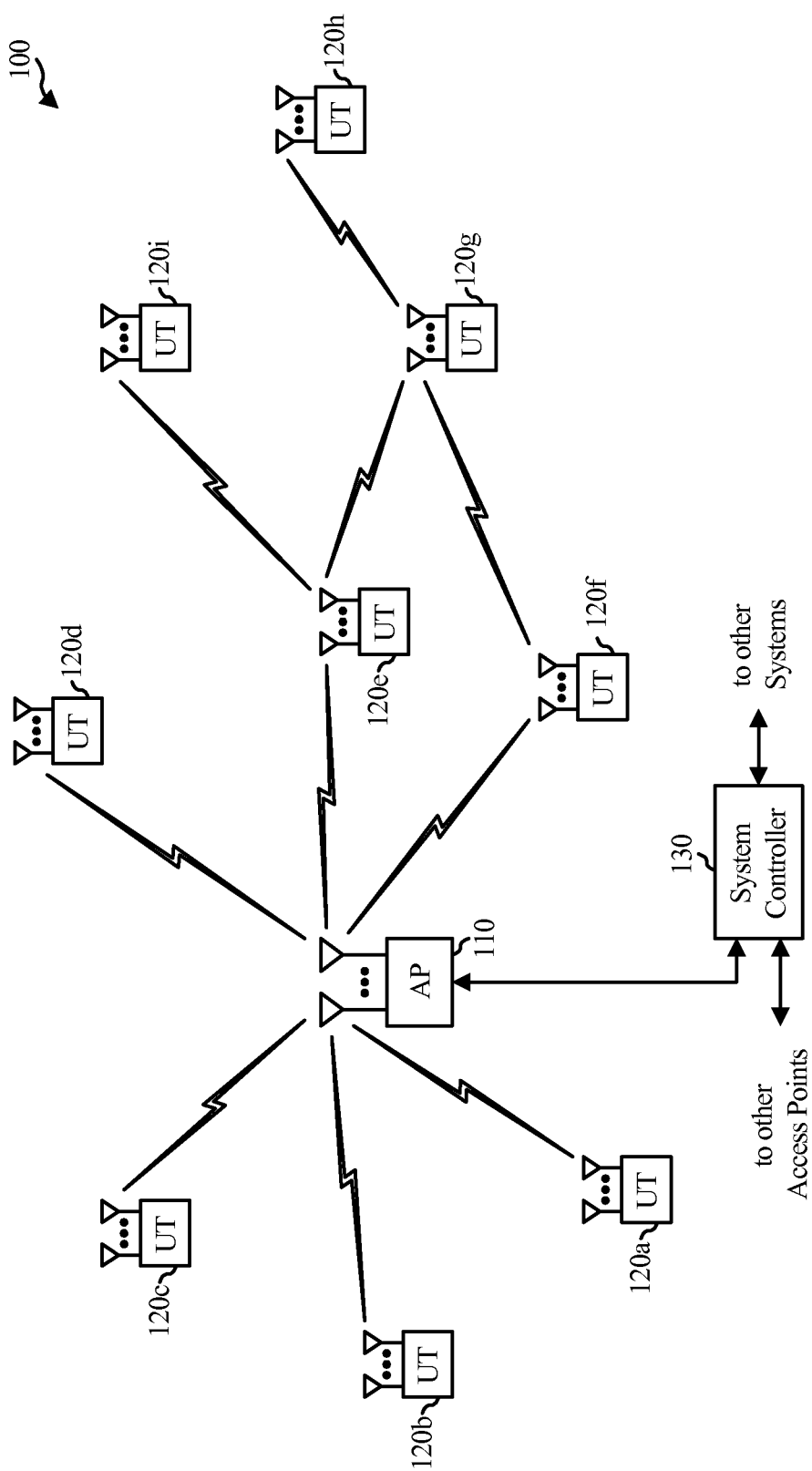
FIG. 1 is a diagram of an example wireless communications network in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
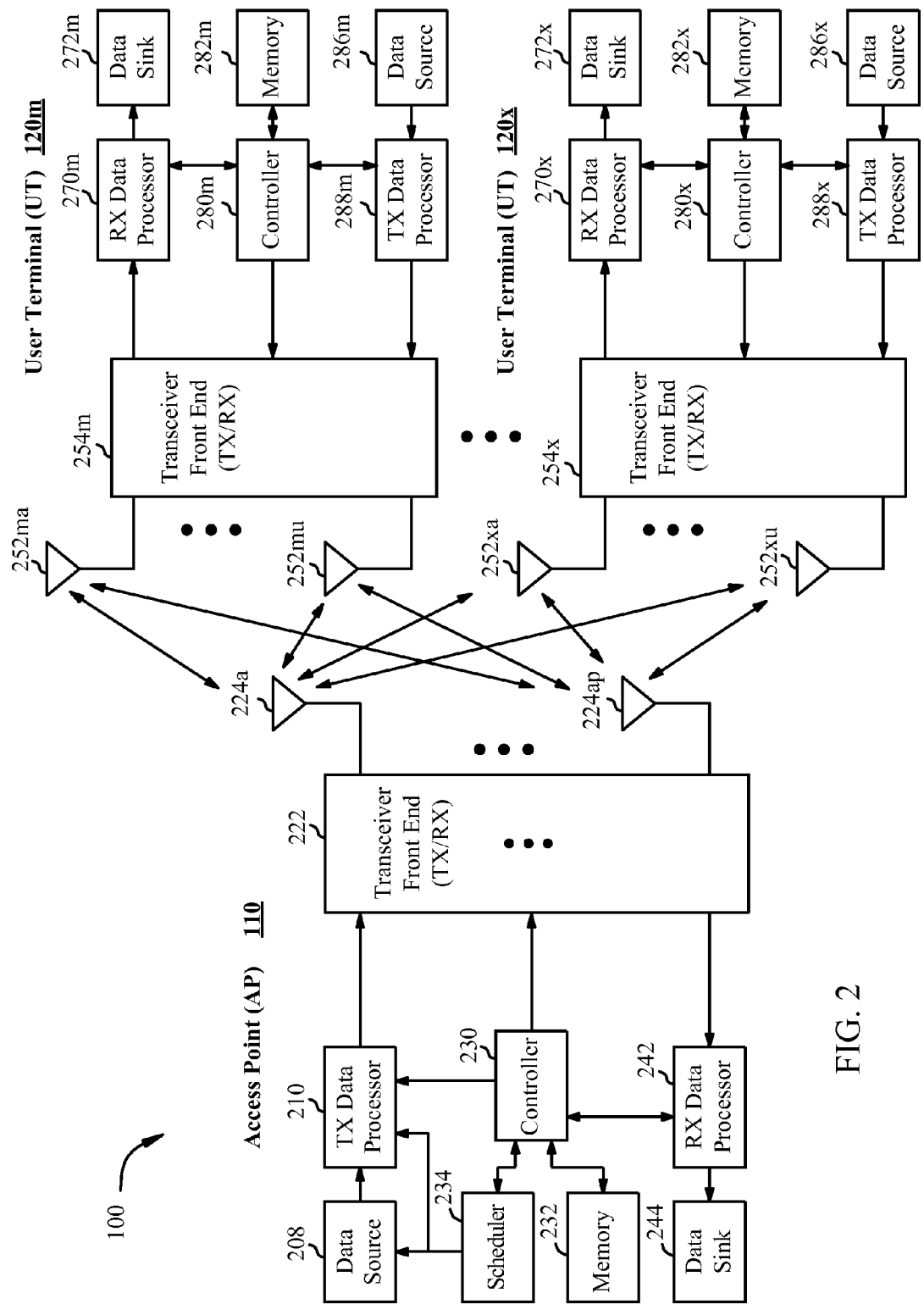
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals may be scheduled for simultaneous transmission on the uplink. Each of these user terminals transmits its set of processed symbol streams on the uplink to the access point.

At access point 110, $N_{up}$ antennas 224a through 224ap receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
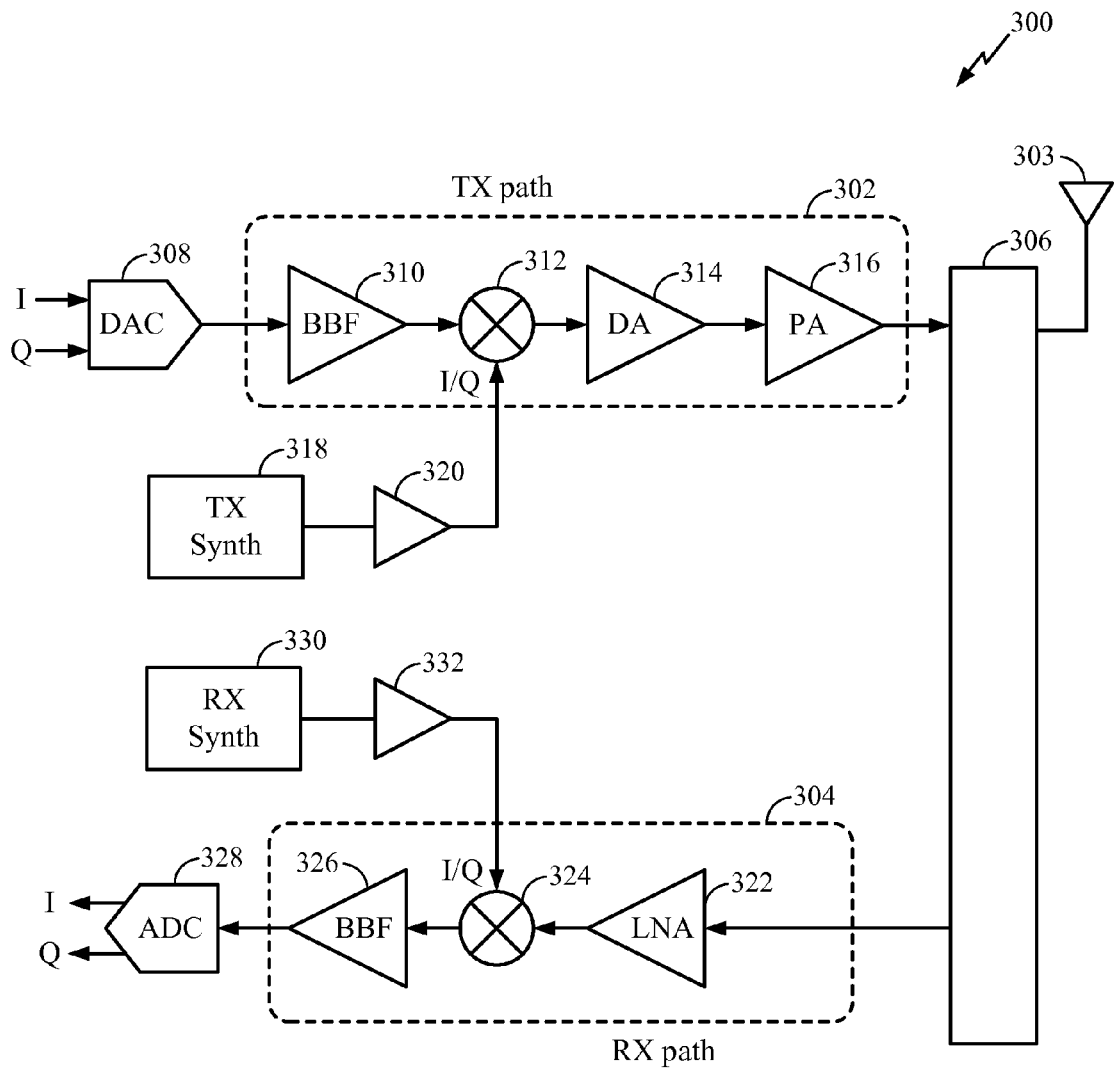
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). Known as heterodyning, this frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324.

Example Sampling Networks for a Switched-Capacitor ADC

Figure 9:
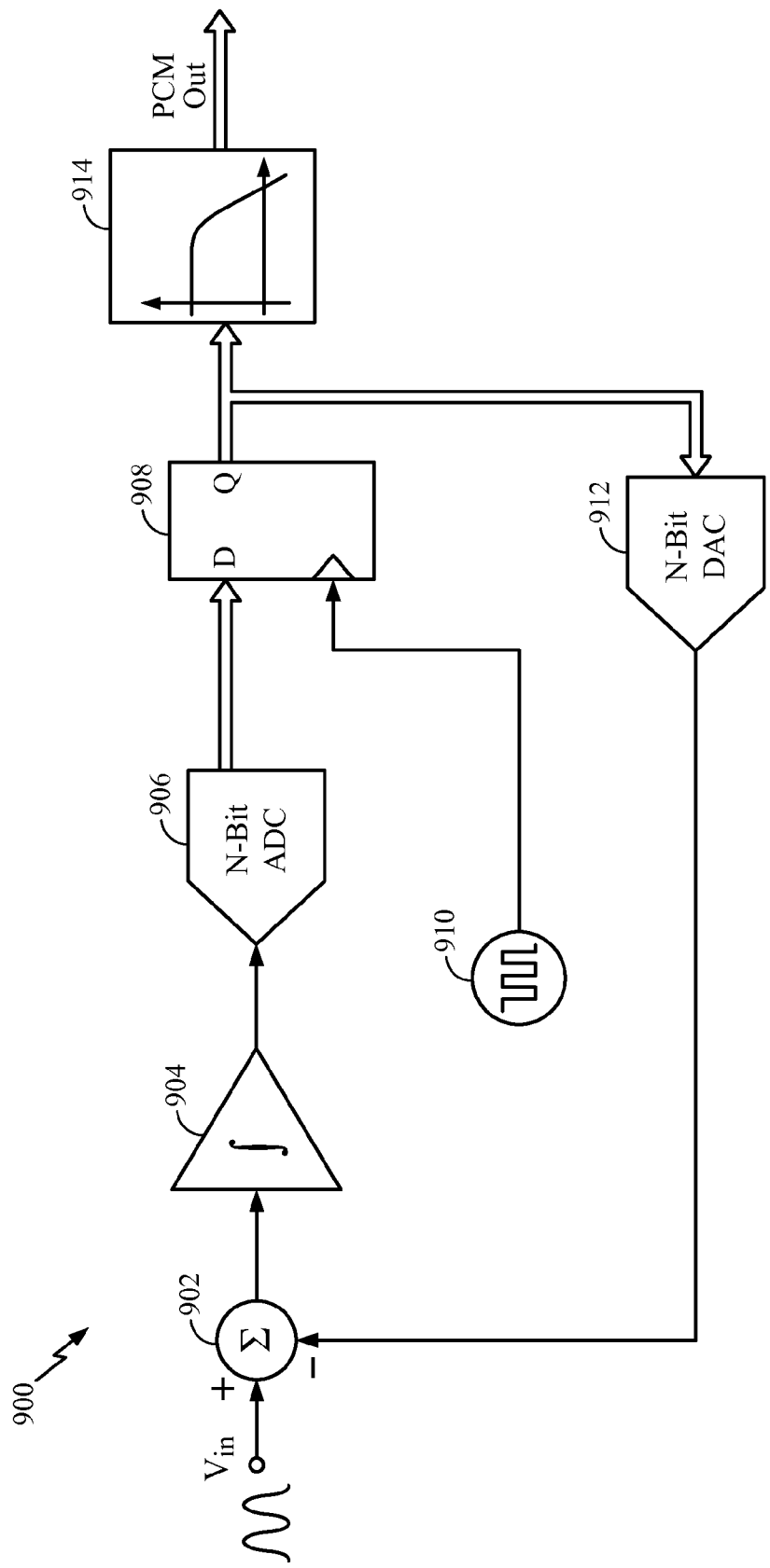
FIG. 9 is a block diagram of an example delta-sigma ($\Delta\Sigma$) analog-to-digital converter (ADC), in accordance with certain aspects of the present disclosure.

An analog-to-digital converter (ADC) (e.g., ADC 328 in the receive chain of FIG. 3) may be implemented with a delta-sigma (ΔΣ) ADC. FIG. 9 is a block diagram of an example N-bit ΔΣ ADC 900, in accordance with certain aspects of the present disclosure. The ΔΣ ADC 900 includes a difference component 902, an integrator 904, an N-Bit ADC 906 (e.g., a succession-approximation ADC), a latch 908, a clock 910, an N-bit digital-to-analog converter (DAC) 912, and a digital low-pass filter (LPF)/decimator 914.

During operation of the ΔΣ ADC 900, an analog input voltage (Vin) is input to the difference component 902, in which the analog output voltage of the DAC 912 is subtracted from the input voltage. Analog integration of the difference is performed by the integrator 904, and the integrated output is sampled and converted to a digital signal by the N-bit ADC 906. In the case of a 1-bit ΔΣ ADC, the N-bit ADC 906 may be replaced by a comparator, which operates effectively as a 1-bit ADC. The N-bit latch (which may be implemented with multiple delay latches) captures the digital output of the ADC 906 at certain times according to the clock 910 and feeds this captured N-bit output to the N-bit DAC 912 for conversion to an analog signal for feeding back to the difference component 902. In the case of a 1-bit ΔΣ ADC, the DAC 912 may output only two different values (VRef+ and VRef−), which determines the input range of the ΔΣ ADC. The output of the latch 908 for a 1-bit ΔΣ ADC is a bitstream, but in the case of a multi-bit converter, the output of the latch 908 is filtered by the digital LPF/decimator 914 to produce a filtered/decimated pulse-code modulated (PCM) output signal.

Figure 4:
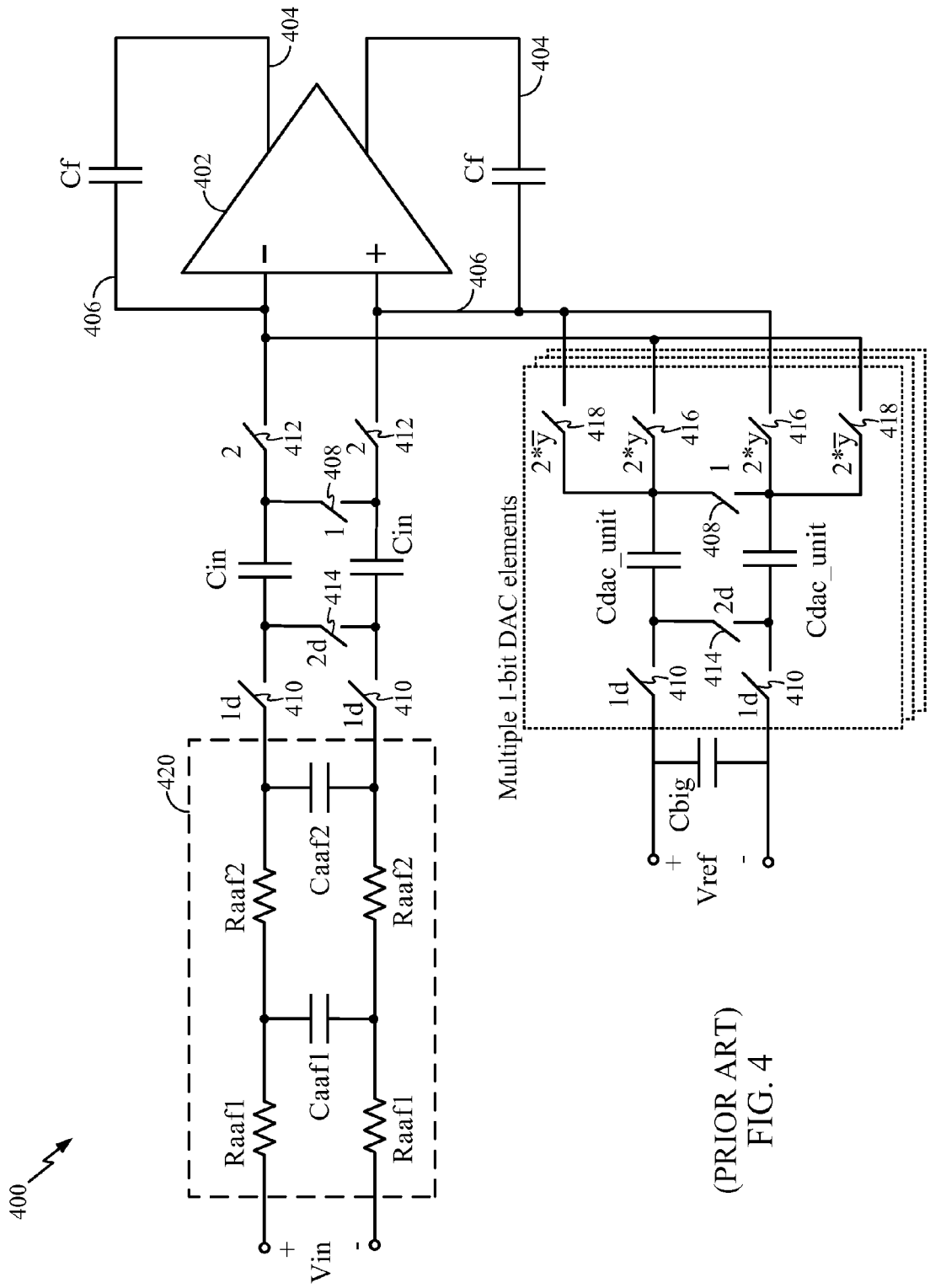
FIGS. 4 and 5 are schematic diagrams of example switched-capacitor integrators with conventional sampling networks, in accordance with the prior art.

An integrator (e.g., the integrator 904) may be implemented with a switched-capacitor integrator having a particular sampling network. FIG. 4 is a block diagram of an example differential switched-capacitor integrator with a conventional sampling network 400. The integrator may include an amplifier 402 (e.g., an operational amplifier) having output nodes 404 and input nodes 406. Feedback capacitors (Cf) provide the integration function via feedback connections from the output nodes 404 to the input nodes 406 of the amplifier 402. A first set of switches 408, 410 is closed during phase 1, which is typically referred to as the "sampling phase," the "preparatory phase," or the "charging phase." Switches 408 are closed upon entering phase 1, whereas switches 410 are closed a slight delay (d) after switches 408 are closed, hence the designation for phase 1d. The first set of switches 408, 410 is open during phase 2, which is typically referred to as the "integration phase," and a second set of switches 412, 414 is closed during phase 2. Switches 412 are closed upon entering phase 2, whereas switches 414 are closed a small delay (d) after switches 412 are closed, hence the designation for phase 2d. During phase 2, either switches 416 or switches 418 may be closed, depending on the decision (y) input to each of multiple 1-bit digital-to-analog converter (DAC) elements used in implementing a single-bit or multi-bit switched-capacitor ADC. For the example of a 1-bit DAC element, switches 416 are closed during phase 2 when the control word input to the DAC element is logical high (e.g., y=1), whereas switches 418 are closed instead during phase 2 when the input to the DAC element is logical low (e.g., y=0). Multiple 1-bit DAC elements may be connected in parallel with independent control bits (e.g., $y_1, y_2, \ldots, y_n$) to implement a multi-bit DAC in a thermometer-coded fashion.

During phase 1 of the sampling network 400, one end of each input sampling capacitor (Cin) is connected with a (filtered) differential input voltage for the ADC, while the other ends of the sampling capacitors Cin are connected together via the first set of switches 408, 410. The sampling capacitors (Cin) may be connected with the input voltage (Vin) via an anti-aliasing filter 420 in an effort to restrict the bandwidth of the input signal to approximately satisfy the Nyquist sampling theorem and avoid aliasing. As illustrated in FIG. 4, the anti-aliasing filter 420 may be a passive, second-order filter having two low-pass filter stages, although a person having ordinary skill in the art will recognize that one or more than two low-pass filter stages may also be used. The filter 420 may include a first stage comprising first resistors (Raaf1) and a first capacitor (Caaf1) and a second stage comprising second resistors (Raaf2) and a second capacitor (Caaf2) creating two poles. For other aspects, the anti-aliasing filter 420 may be an active filter.

Also during phase 1 of the sampling network 400, one end of each reference sampling capacitor (Cdac_unit) in each DAC element may be connected to a reference voltage (Vref), while the other ends of the reference sampling capacitors are connected together via the first set of switches 408, 410. In this manner, Cin and Cdac_unit sample Vin and Vref, respectively, during phase 1. During phase 2, the sampled reference voltage is added to the sampled input voltage according to the DAC decision (y), and the resulting signal is integrated by the amplifier 402 and the integration capacitor (Cf). n such DAC elements may be connected in parallel with independent control bits (e.g., $y_1, y_2, \ldots, y_n$) to implement a multi-bit DAC with total effective DAC capacitance Cdac=n*Cdac_unit.

For such a conventional sampling network 400 where the input sampling network and reference sampling network are separate, the switched-capacitor integrator may employ a slow reference buffer and a large bypass capacitor (Cbig) as a battery. The major disadvantages of separate input and reference paths include: (1) switch thermal noise is sampled on both Cin and Cdac, so input-referred thermal noise is gained up to sqrt[2 kT/Cin(1+Cdac/Cin)]; (2) in phase 2, op amp input flicker and thermal noise are sampled on both Cin and Cdac, so the op amp noise is also gained up by (1+Cdac/Cin); (3) the anti-aliasing filter (AAF) 420 has insertion loss from the input path since Cin will be reset to zero (i.e., grounded) in every clock period and the AAF charges Cin back to Vin, and this insertion loss gains up the noise; and (4) the feedback factor is Cf/(Cf+Cin+Cdac) at phase 2, which is relatively small and leads to increased op amp current.

Figure 5:
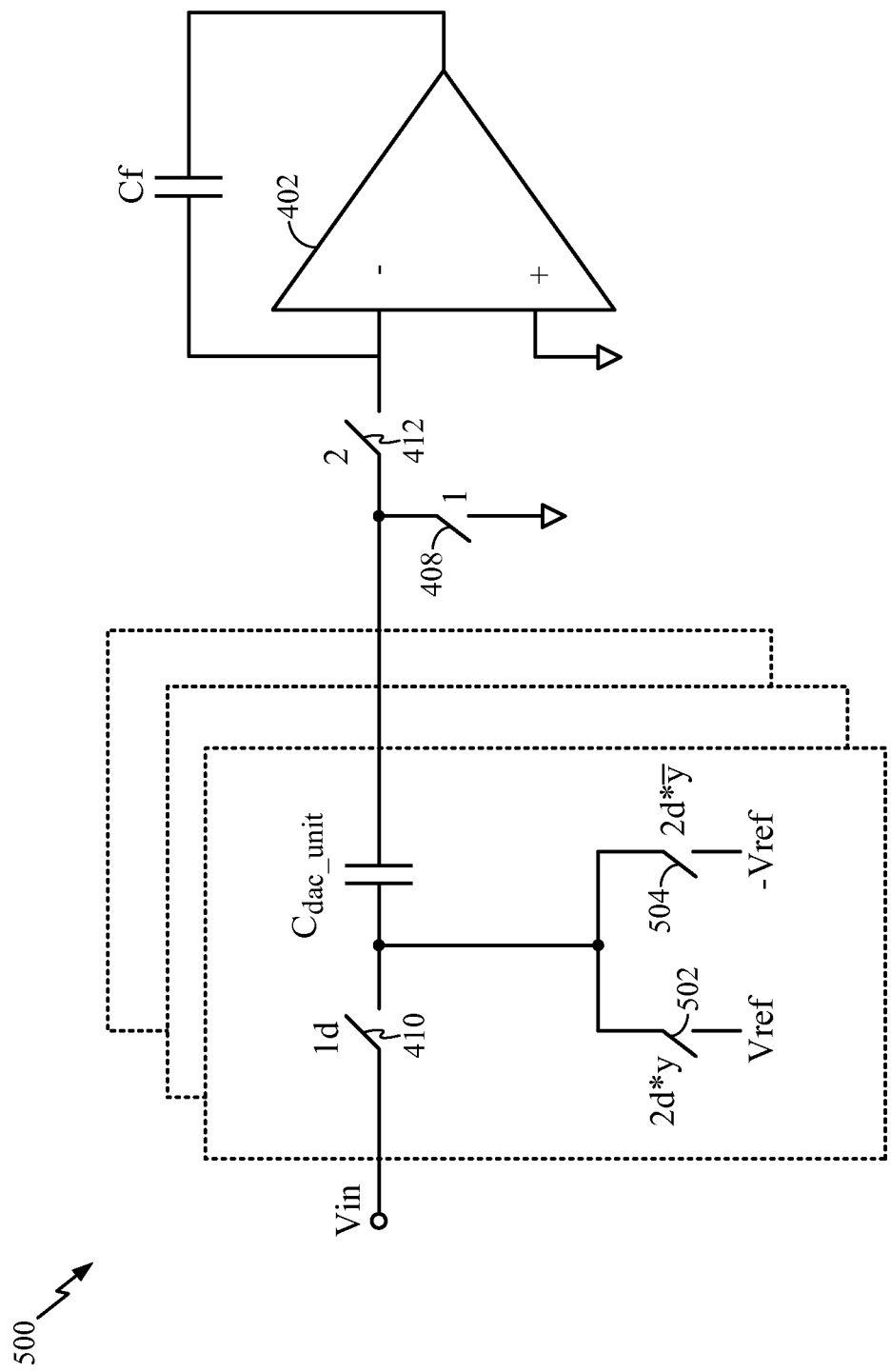

FIG. 5 is a block diagram of another example conventional sampling network 500. In this scheme, the input and DAC paths are shared (i.e., only a single capacitor (Cdac) is used), and the DAC decision (y) is applied on the reference path during the integration phase (phase 2) by closing switch 502 (y) or switch 504 ($\bar{y}$). The single sampling capacitor (Cdac) may in fact be composed of an individual input sampling capacitor (Cdac_unit) in each of one or more DAC elements, as described above. The major disadvantages of this scheme are: (1) the reference generator provides the quantization noise charge, as the DAC feedback in delta-sigma ADCs includes shaped quantization noise, which can cause out-of-band quantization noise to fold in-band (thereby suggesting a fast reference buffer to drive Cdac during phase 2 or a large external capacitor); (2) such a high-speed reference buffer is power hungry; and (3) a high-bandwidth reference buffer leads to higher noise and poor power supply rejection ratio (PSRR).

Accordingly, what is needed is a low noise, low power passive sampling network for a switched-capacitor ADC with a slow reference generator.

Figure 6A:
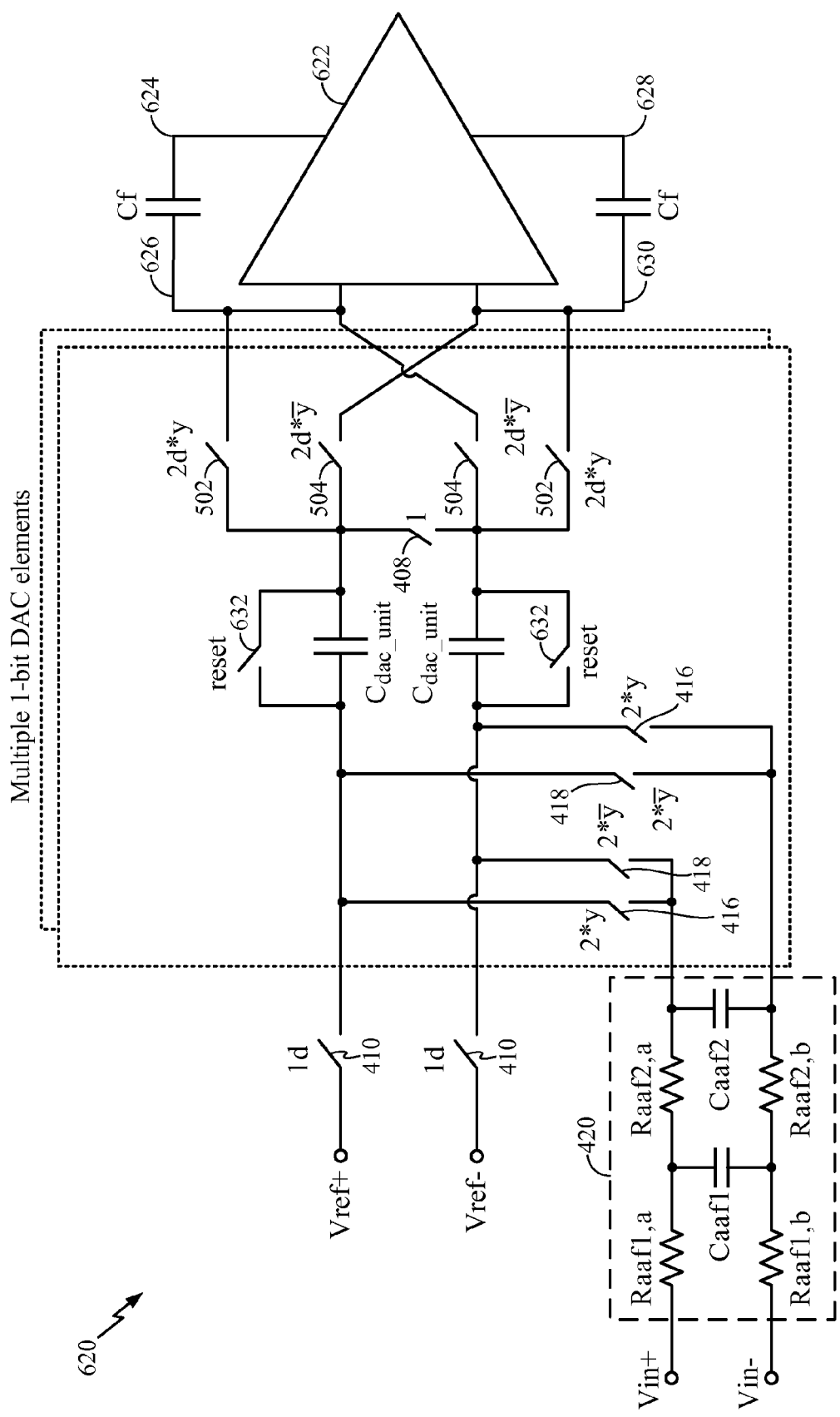
FIG. 6A is a schematic diagram of an example differential switched-capacitor integrator with a sampling network using only a single sampling capacitor in each differential path for the integrator and omitting a high-bandwidth reference buffer, in accordance with certain aspects of the present disclosure.

FIG. 6A is a block diagram of an example sampling network 620 with a differential switched-capacitor integrator where a single sampling capacitor (Cdac) in each differential path functions as both the input sampling capacitor and the reference sampling capacitor, in accordance with certain aspects of the present disclosure. The single sampling capacitor (Cdac) may in fact be composed of an individual input sampling capacitor (Cdac_unit) in each differential path of one or more DAC elements, as described above.

In the sampling network 620 of FIG. 6A, the differential amplifier 622 has two feedback capacitors (Cf), one Cf connected between the negative output node 624 and the negative input node 626, and another Cf connected between the positive output node 628 and the positive input node 630. During phase 1 (the sampling phase), the differential reference voltage (Vref+−Vref−) is sampled by the individual sampling capacitors (Cdac_unit) in each DAC element's differential path via the first set of switches 408, 410. During phase 2 (the integration phase), the filtered output of the differential input voltage (Vin+−Vin−) is applied to the individual sampling capacitors (Cdac_unit) in each DAC element's differential path via the second set of switches 416, 418, 502, 504. In this sampling network 620, the DAC decision (y) is applied on the input path, rather than the reference path, in contrast with the sampling network 500 of FIG. 5.

In the sampling network 620 of FIG. 6A, Caaf2 is acting as a battery to provide all the charge involved, since Caaf2 is typically larger than the sampling capacitors (Cdac) in each differential path. Even though quantization noise may be coupled back to the anti-aliasing filter 420 additively, there may be no noise mixing (i.e., no translation of high frequency quantization noise to fold in-band), and the resulting noise is much lower than the ADC quantization noise floor. This topology may also reduce the ADC input-referred noise, introduce no anti-aliasing filter insertion loss, and reduce op amp area and power.

Furthermore, for certain aspects, the individual sampling capacitors (Cdac_unit) in each differential path of a DAC element may be reset (e.g., via switches 632 shorting the terminals of Cdac_unit) following each integration phase 2, and before the individual sampling capacitors are connected back to the differential reference voltage in sampling phase 1. By doing so, the differential reference voltage provides constant charge each clock cycle, so there is no concern about out-of-band noise mixing with the reference and folding in-band, and thus no need for a high-bandwidth reference buffer with this topology. This may be done in instances where, for example, diminished bandwidth specifications of the reference generator in comparison to the sampling phase duration and a relatively small bypass capacitance (not shown) are desired.

Figure 6B:
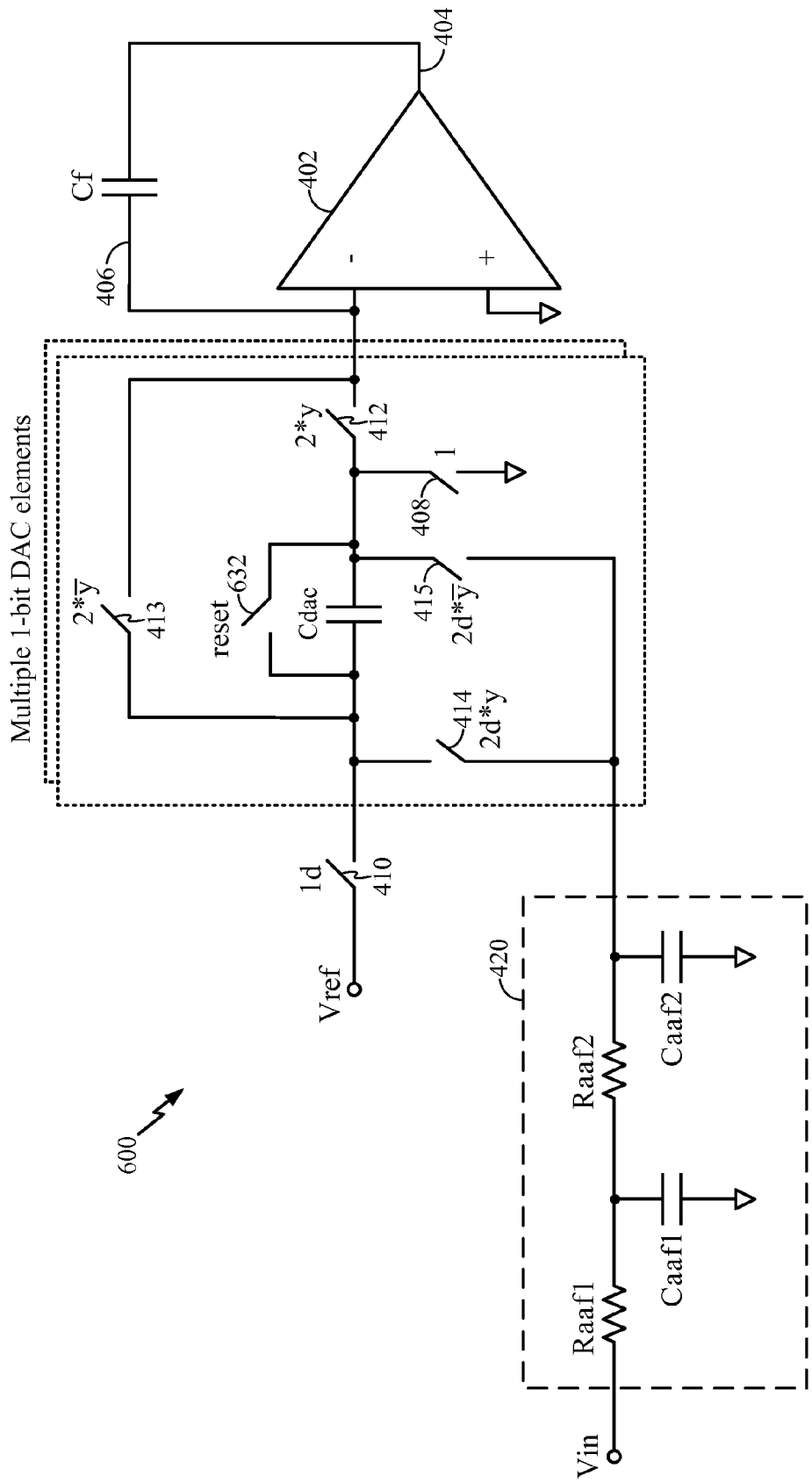
FIG. 6B is a schematic diagram of an example single-ended switched-capacitor integrator with a sampling network using only a single sampling capacitor and omitting a high-bandwidth reference buffer, in accordance with certain aspects of the present disclosure.

FIG. 6B is a block diagram of an example sampling network 600 with a single-ended switched-capacitor integrator where a single sampling capacitor (Cdac) functions as both the input sampling capacitor and the reference sampling capacitor, in accordance with certain aspects of the present disclosure. The single-ended circuit topology of FIG. 6B is similar to the differential circuit topology in FIG. 6A, where similar advantages apply.

During phase 1, the first set of switches 408, 410 are used to sample Vref, where switch 410 closes with a slight delay after switch 408. During phase 2, the second set of switches 412-415 are used to connect the filtered input voltage (Vin) at the output of the anti-aliasing filter 420 with one end of Cdac, while the other end of Cdac is connected with the input node 406 of the amplifier 402. Applying Vin to the sole sampling capacitor during the integration phase (phase 2) is unlike other switched-capacitor integrator topologies, such as the network 500 in FIG. 5, where the sampling capacitor has Vref applied during the integration phase.

In the sampling network 600 of FIG. 6B, Caaf2 is acting as a battery to provide all the charge involved, since Caaf2 is typically larger than Cdac. Even though quantization noise may be coupled back to the anti-aliasing filter 420, there may be no noise mixing, and the resulting noise is much lower than the ADC quantization noise floor. This topology may also reduce the ADC input-referred noise, introduce no anti-aliasing filter insertion loss, and reduce op amp area and power.

For certain aspects, Cdac may be reset (e.g., via a switch 632 shorting the terminals of Cdac) following each integration phase 2, and before Cdac is connected back to Vref in sampling phase 1. By doing so, Vref provides constant charge each clock cycle, so there is no concern about out-of-band quantization noise mixing with the reference and folding in-band, and thus no need for a high-bandwidth reference buffer with this topology. This may be done in instances where, for example, the bypass capacitance on Vref is relatively large and the on-resistance of the first set of switches 408, 410 is small.

With the sampling networks 620 and 600 of FIGS. 6A and 6B, the benefits of sampling network 500 are achieved, but with a slower, simpler Vref and a passive anti-aliasing filter 420. This provides several benefits for the switched-capacitor ADC. Since the input and reference sampling capacitors are one and the same, input-referred thermal noise from the sampler is sqrt(2 kT/Cdac) from DC to Fs/2, where Fs is the sampling frequency. This represents a 3 dB noise benefit compared to sampling network 400, which may allow for a smaller sampling capacitance value. A smaller capacitance value and an improved feedback factor may reduce amplifier power and area. Also, input-referred thermal noise and flicker noise (1/f noise) from the amplifier 402 or 622 may be reduced. Moreover, in contrast to the sampling network 400 in FIG. 4 where the input sampling capacitors (Cin) provide input charge proportional to the input signal swing, the sampling capacitance (Cdac) of FIGS. 6A and 6B provides a difference charge between the input signal and the DAC feedback signal (e.g., charge corresponding to the ADC quantization noise). As a result, there is no AAF insertion loss, so the AAF may be scaled down even more than the reduction in the sampling capacitor.

In some delta-sigma ADC topologies (such as delta-sigma ADCs using feed-forward topologies), it may be desired to have a delay on the input sampling network in an effort to match the delay from a quantizer in the feed-forward path so that the DAC code arriving at the integrator corresponds to the same input sample that the integrator is processing. This delay may be implemented to achieve a flat frequency response in the input-to-ADC-output signal transfer function (STF) with no peaking.

Figure 7:
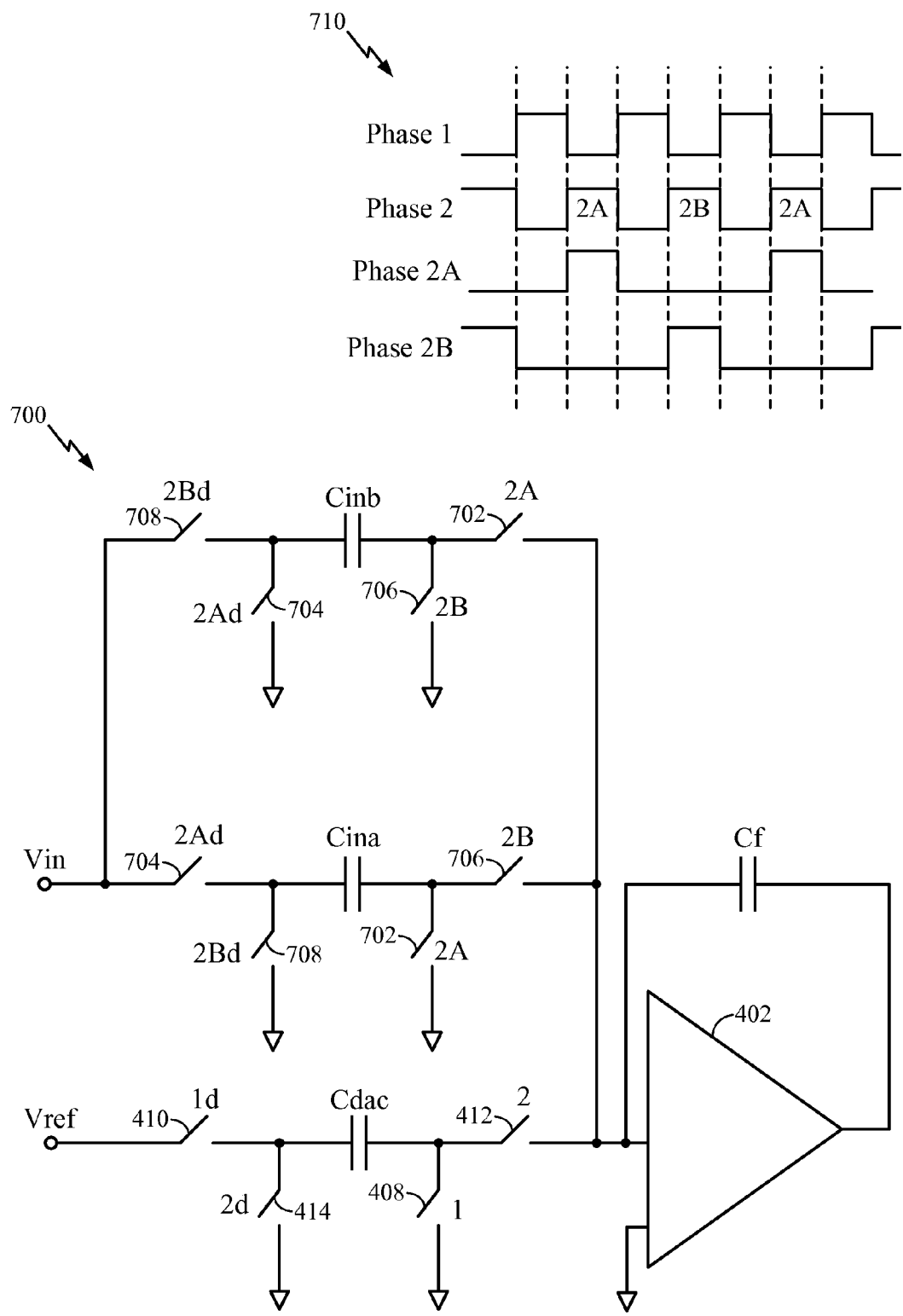
FIG. 7 is a schematic diagram of an example switched-capacitor integrator having a conventional sampling network with a sample-hold delay, in accordance with the prior art.

FIG. 7 is a block diagram of an example conventional sampling network 700 that implements such a delay. In this implementation, a feed-forward topology and an A/B sampling network are utilized in an effort to cancel the quantized DAC feedback signal perfectly.

The ADC sampling clock frequency of phase 1 may be divided by two, and the integration phase (phase 2) of alternate clock cycles may be referred to as phase 2A and phase 2B, such that phases 2A and 2B are one whole clock cycle apart, as illustrated in the timing diagram 710 of FIG. 7. The input voltage (Vin) is sampled during phase 2, which is separated into the two phases 2A and 2B. A third set of switches 702, 704 is closed during phase 2A. Switches 702 are closed upon entering phase 2A, whereas switches 704 are closed a slight delay (d) after switches 702 are closed, hence the designation for phase 2Ad. The third set of switches 702, 704 is open during phase 2B, and a fourth set of switches 706, 708 is closed during phase 2B. Switches 706 are closed upon entering phase 2B, whereas switches 708 are closed a small delay (d) after switches 706 are closed, hence the designation for phase 2Bd. During phase 2A, a first input sampling capacitor (Cina) samples the input voltage (Vin), and a second input sampling capacitor (Cinb) transfers the charge that was previously sampled to the feedback capacitor (Cf). During phase 2B, Cina transfers its charge to Cf, and Cinb samples Vin. Thus, during every phase 2 (whether 2A or 2B), one of the input sampling capacitors (Cina or Cinb) is in parallel with Cdac, the sampled reference voltage is added to the input voltage sampled one clock period earlier, and a one-clock-cycle delay is achieved in the sampling network 700. The resulting signal is integrated by the amplifier 402 and the integration capacitor (Cf).

Certain aspects of the present disclosure may be adapted to the sampling network 700 or other such sampling networks. Split into two different sheets, FIGS. 8A and 8B combined are a schematic diagram of an example sampling network 800 where the input sampling capacitor (alternating between Cina and Cinb) and the reference sampling capacitor (Cdac) are connected in series during phase 2, in accordance with certain aspects of the present disclosure. This topology is similar to the example sampling network 620 in FIG. 6A, except that the input clock frequency is divided by two and every alternate phase 2 corresponds to phase 2A or phase 2B, as described above with respect to timing diagram 710. Differential voltage Va+−Va− in FIGS. 8A and 8B corresponds to the filtered differential input voltage output from the anti-aliasing filter 420 in FIG. 6A.

The sampling capacitors Cina and Cinb may be effectively considered as part of the preceding anti-aliasing filter stage and built using some or all of the Caaf2 capacitor in the anti-aliasing filter 420. For certain aspects, Cina and Cinb are nominally equal. Added with Caaf2, these capacitors behave similar to the battery capacitor Caaf2 in FIG. 6A. In order to achieve comparable noise with the same Cdac as FIG. 6A, Cina and Cinb may be substantially larger than Cdac (e.g., 10×), since the noise is determined by the series combination of Cina (or Cinb) and Cdac. However, minimum area for a given noise performance may be achieved by making Cina=Cinb=Cdac.

Figure 8A:
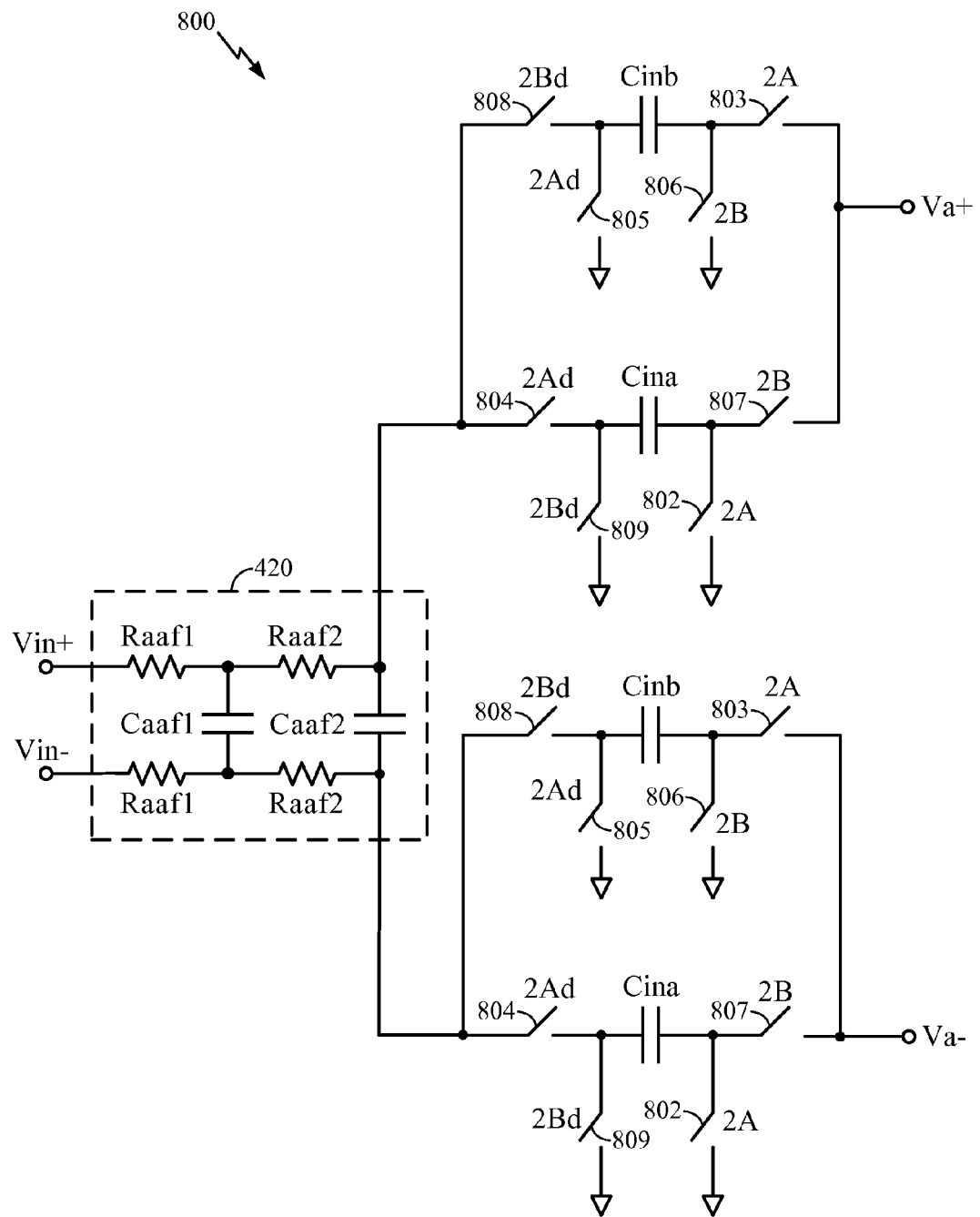
FIGS. 8A and 8B combined are a schematic diagram of an example switched-capacitor integrator having a sampling network with a sample-hold delay, where one of the input sampling capacitors and the reference sampling capacitor are connected in series during the integration phase, in accordance with certain aspects of the present disclosure.
Figure 8B:
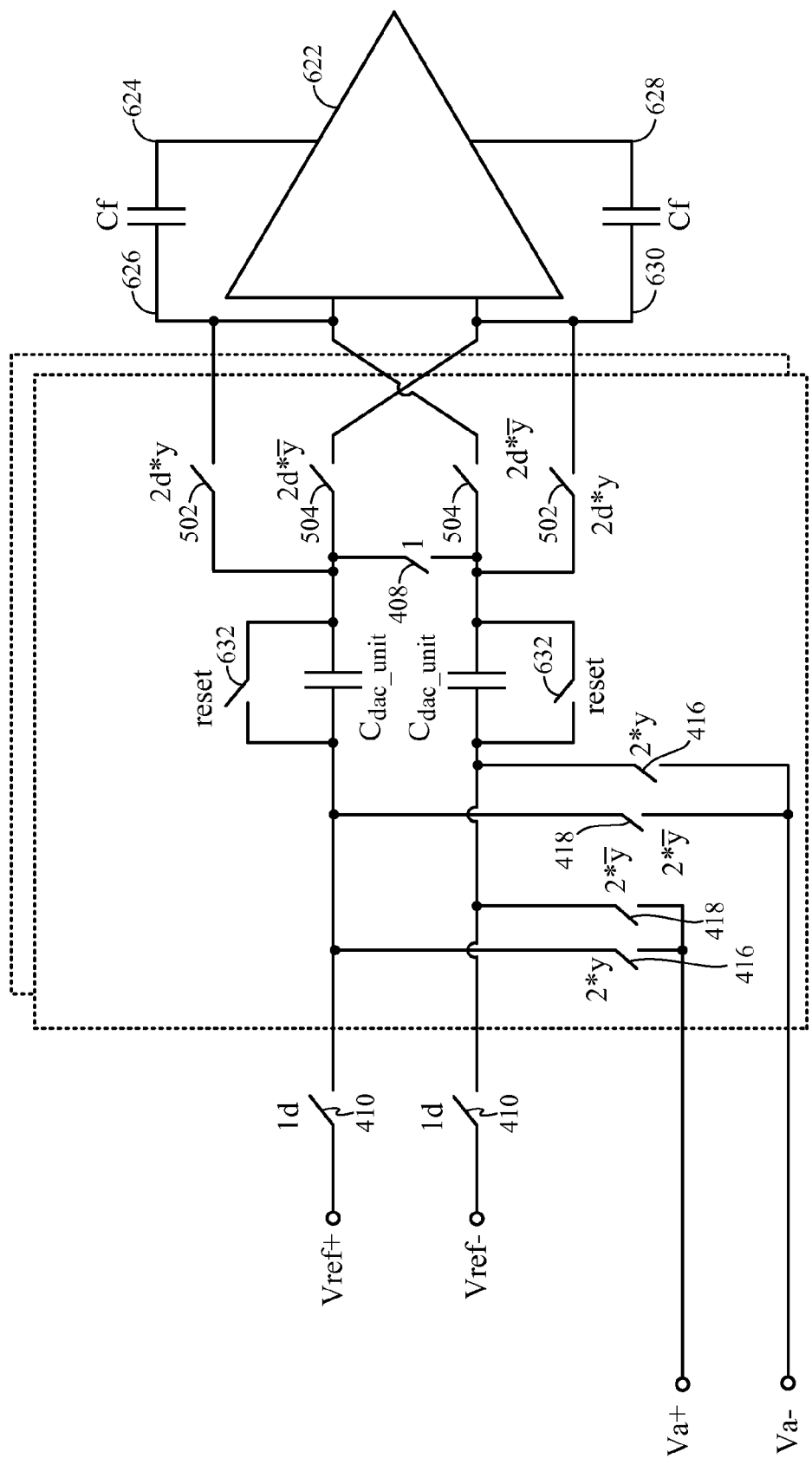

As described above for the sampling network 620 of FIG. 6A, reset switch 632 may be used to reset Cdac following each integration phase 2 before sampling the reference voltage in phase 1 (i.e., the reference sampling phase) in an effort to relax the reference buffer design. Although a differential sampling network is shown in FIGS. 8A and 8B, this idea may be adapted to a single-ended sampling network, as well.

In the sampling network 800, an A/B network may still be used to match quantizer delay, and there may not be a signal transfer function (STF) peaking issue. Thermal noise of the sampling network 800 may be the same as that of the sampling network 700 of FIG. 7. There may be no insertion loss from an AAF 420 between Vin and the A/B sampling network since signal charge will still remain on the input sampling capacitors after integration. At phase 2 (the integration phase), integrator loading may be reduced.

According to certain aspects, each of the A/B sampling networks includes: (1) a third set of switches 802, 804 configured to selectively connect an input node (e.g., Vin+, Vin−, or a filtered version thereof) of the A/B sampling network with Cina during a first set of input sampling phases (e.g., before, during, and/or after integration phase 2A); (2) a fourth set of switches 803, 805 configured to connect an output node (Va+ or Va−) of the A/B sampling network with Cinb during phase 2A; (3) a fifth set of switches 806, 808 configured to selectively connect the input node of the A/B sampling network with Cinb during a second set of input sampling phases (e.g., before, during, and/or after integration phase 2B); and (4) a sixth set of switches 807, 809 configured to connect the output node of the A/B sampling network with Cina during phase 2B. For certain aspects, the third set of switches 802, 804 is further configured to selectively connect (e.g., during a first set of input sampling phases) one side of Cina to a first voltage level (e.g., an electrical ground (as shown) or a DC bias voltage), and the fourth set of switches 803, 805 is further configured to selectively connect (e.g., during phase 2A) one side of Cinb to a second voltage level. The second voltage level may be the same or different from the first voltage level. For certain aspects, the fifth set of switches 806, 808 is further configured to selectively connect (e.g., during a second set of the input sampling phases) one side of Cinb to a third voltage level (which may be the same as the first voltage level), and the sixth set of switches 807, 809 is further configured to selectively connect (e.g., during phase 2B) one side of Cina to a fourth voltage level (which may be the same as the second voltage level). For certain aspects, the third set of switches 802, 804 and the fourth set of switches 803, 805 are open during phase 2B, whereas the fifth set of switches 806, 808 and the sixth set of switches 807, 809 are open during phase 2A.

According to certain aspects during the input sampling phases, the input sampling capacitors (Cina and Cinb) may be grounded at one end (or otherwise connected to a particular voltage level) and connected with the (filtered) input voltage (Vin) at the other end using a particular configuration of the third, fourth, fifth, and sixth sets of switches 802-809. The input sampling phases may or may not coincide with the integration phases (phases 2A and 2B), and the first set of the input sampling phases is different from the second set of the input sampling phases. For certain aspects, the first set of the input sampling phases can coincide with the first set of the integration phases 2A, and the second set of the input sampling phases can coincide with the second set of the integration phases 2B (as shown in the example of FIG. 8A). In general, however, the first set of the input sampling phases (when the third set of switches 802, 804 is closed) may overlap any portion of the reference sampling phases (e.g., phase 1 when the first set of switches 408, 410 is closed) and/or phase 2A, but not any portion of phase 2B (where the sixth set of switches 807, 809 is closed). Likewise, the second set of the input sampling phases (when the fifth set of switches 806, 808 is closed) may overlap any portion of the reference sampling phases and/or phase 2B, but not any portion of phase 2A (where the fourth set of switches 803, 805 is closed).

According to certain aspects, the third, fourth, fifth, and sixth sets of switches 802-809 are open during the reference sampling phases (e.g., phase 1). For other aspects, the third set of switches 802, 804 is closed, and the sixth set of switches 807, 809 is open, during the first set of the input sampling phases. In this case, the fifth set of switches 806, 808 may be closed, and the fourth set of switches 803, 805 may be open, during the second set of the input sampling phases.

According to certain aspects, each sampling network may include more than two input sampling capacitors. In this case, there may be more than two different sets of integration phases. For example, in the case of three input sampling capacitors, there may be three different sets of integration phases (e.g., phases 2A, 2B, and 2C), where one set of the integration phases includes every third integration phase. Moreover, the input sampling phases (for connecting the input nodes with the input sampling capacitors) may include more than two sets of input sampling phases, which need not coincide with the different sets of integration phases.

According to other aspects, each sampling network may include a single input sampling capacitor. For example, each sampling network may include input sampling capacitor Cina, the third set of switches 802, 804, and the sixth set of switches 807, 809 as described above with respect to FIG. 8A. With a single input sampling capacitor, there may be a single set of integration phases. Moreover, the input sampling phases (for connecting the input nodes with the input sampling capacitors) may include one set of input sampling phases, which need not coincide with the single set of integration phases.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application-specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A switched-capacitor integrator, comprising:
   an amplifier having first and second output nodes and first and second input nodes;
   a first integration capacitor coupled between the first output node and the first input node;
   a second integration capacitor coupled between the second output node and the second input node;
   first and second sampling capacitors, each having a first terminal and a second terminal;
   a first set of switches configured to
      connect reference voltage nodes with the first terminals of the first and second sampling capacitors during a sampling phase of the integrator; and
      short the second terminals of the first and second sampling capacitors together during the sampling phase; and
   a second set of switches configured, during an integration phase of the integrator, to connect:
      input voltage nodes with the first terminals of the first and second sampling capacitors; and
      the first and second input nodes of the amplifier with the second terminals of the first and second sampling capacitors, wherein the first set of switches is open during the integration phase and wherein the second set of switches is open during the sampling phase.

2. The integrator of claim 1, wherein the reference voltage nodes comprise a positive reference voltage node and a negative reference voltage node and wherein the input voltage nodes comprise a positive input voltage node and a negative input voltage node.

3. The integrator of claim 2, wherein the first set of switches is configured to connect:
   the positive reference voltage node with the first terminal of the first sampling capacitor;
   the negative reference voltage node with the first terminal of the second sampling capacitor; and
   the second terminal of the first sampling capacitor with the second terminal of the second sampling capacitor.

4. The integrator of claim 3, wherein in a first configuration, the second set of switches is configured to connect:
   the positive input voltage node with the first terminal of the first sampling capacitor;
   the negative input voltage node with the first terminal of the second sampling capacitor;
   the first input node of the amplifier with the second terminal of the first sampling capacitor; and
   the second input node of the amplifier with the second terminal of the second sampling capacitor.

5. The integrator of claim 4, wherein in a second configuration, the second set of switches is configured to connect:
   the positive input voltage node with the first terminal of the second sampling capacitor;
   the negative input voltage node with the first terminal of the first sampling capacitor;
   the first input node of the amplifier with the second terminal of the second sampling capacitor; and
   the second input node of the amplifier with the second terminal of the first sampling capacitor.

6. The integrator of claim 5, wherein selection between the first and second configurations is controlled by a digital input to a digital-to-analog converter (DAC) in a delta-sigma modulator comprising the integrator.

7. The integrator of claim 5, wherein the first configuration is selected if a control bit for the second set of switches has a first logic level and wherein the second configuration is selected if the control bit has a second logic level opposite the first logic level.

8. The integrator of claim 1, wherein:
   the second set of switches has a first configuration and a second configuration; and
   selection between the first and second configurations is controlled by a digital input to a digital-to-analog converter (DAC) in a delta-sigma modulator comprising the integrator.

9. A switched-capacitor integrator, comprising:
   an amplifier having first and second output nodes and first and second input nodes;
   a first integration capacitor coupled between the first output node and the first input node;
   a second integration capacitor coupled between the second output node and the second input node;
   first and second sampling capacitors, each having a first terminal and a second terminal;
   a first set of switches configured to connect reference voltage nodes with the first terminals of the first and second sampling capacitors during a sampling phase of the integrator;
   a second set of switches configured, during an integration phase of the integrator, to connect:
      input voltage nodes with the first terminals of the first and second sampling capacitors; and
      the first and second input nodes of the amplifier with the second terminals of the first and second sampling capacitors, wherein the first set of switches is open during the integration phase and wherein the second set of switches is open during the sampling phase; and
   an anti-aliasing filter connected between the input voltage nodes and a portion of the second set of switches, wherein a filter capacitor of the anti-aliasing filter has a substantially larger capacitance than the first sampling capacitor and the second sampling capacitor.

10. A switched-capacitor integrator, comprising:
    an amplifier having first and second output nodes and first and second input nodes;
    a first integration capacitor coupled between the first output node and the first input node;
    a second integration capacitor coupled between the second output node and the second input node;
    first and second sampling capacitors, each having a first terminal and a second terminal;
    a first set of switches configured to connect reference voltage nodes with the first terminals of the first and second sampling capacitors during a sampling phase of the integrator;
    a second set of switches configured, during an integration phase of the integrator, to connect:
       input voltage nodes with the first terminals of the first and second sampling capacitors; and
       the first and second input nodes of the amplifier with the second terminals of the first and second sampling capacitors, wherein the first set of switches is open during the integration phase and wherein the second set of switches is open during the sampling phase; and
    a third set of switches configured to short at least one of the first or second sampling capacitor between the integration phase and the sampling phase.

11. A switched-capacitor integrator, comprising:
    an amplifier having first and second output nodes and first and second input nodes;
    a first integration capacitor coupled between the first output node and the first input node;

a second integration capacitor coupled between the second output node and the second input node;
first and second sampling capacitors, each having a first terminal and a second terminal;
a first set of switches configured to connect reference voltage nodes with the first terminals of the first and second sampling capacitors during a sampling phase of the integrator;
a second set of switches configured, during an integration phase of the integrator, to connect:
input voltage nodes with the first terminals of the first and second sampling capacitors; and
the first and second input nodes of the amplifier with the second terminals of the first and second sampling capacitors, wherein:
the first set of switches is open during the integration phase;
the second set of switches is open during the sampling phase; and
the first and second sampling capacitors and the second set of switches are part of a digital-to-analog converter (DAC) element having its own control bit; and
one or more additional DAC elements replicating the DAC element, each of the additional DAC elements having a control bit.

12. A switched-capacitor integrator, comprising:
an amplifier comprising an output node and an input node;
an integration capacitor coupled between the output node and the input node of the amplifier;
a sampling capacitor having a first terminal and a second terminal;
a first set of switches configured to connect a reference voltage node with the first terminal of the sampling capacitor during a sampling phase of the integrator; and
a second set of switches configured, during an integration phase of the integrator, to connect:
an input voltage node with the first terminal of the sampling capacitor in a first configuration;
the input voltage node with the second terminal of the sampling capacitor in a second configuration;
the input node of the amplifier with the second terminal of the sampling capacitor in the first configuration; and
the input node of the amplifier with the first terminal of the sampling capacitor in the second configuration, wherein the first set of switches is open during the integration phase and wherein the second set of switches is open during the sampling phase.

13. The integrator of claim 12, wherein the first configuration is selected if a control bit has a first logic level and wherein the second configuration is selected if the control bit has a second logic level opposite the first logic level.

14. The integrator of claim 12, further comprising an anti-aliasing filter connected between the input voltage node and a portion of the second set of switches, wherein a filter capacitor of the anti-aliasing filter has a substantially larger capacitance than the sampling capacitor.

15. The integrator of claim 12, wherein:
the first set of switches is configured to connect the second terminal of the sampling capacitor with a voltage level during the sampling phase;
the input node comprises a negative terminal of the amplifier; and
a positive terminal of the amplifier is connected with the voltage level.

16. The integrator of claim 12, further comprising a switch configured to short the sampling capacitor between the integration phase and the sampling phase.

17. The integrator of claim 12, wherein selection between the first and second configurations is controlled by a digital input to a digital-to-analog converter (DAC) in a delta-sigma modulator comprising the integrator.

18. The integrator of claim 12, wherein:
the sampling capacitor and the second set of switches are part of a digital-to-analog converter (DAC) element having its own control bit; and
the integrator further comprises one or more additional DAC elements replicating the DAC element, each of the additional DAC elements having a control bit and connected in parallel with the DAC element.

19. A switched-capacitor integrator, comprising:
an amplifier having first and second output nodes and first and second input nodes;
a first integration capacitor coupled between the first output node and the first input node;
a second integration capacitor coupled between the second output node and the second input node;
first and second sampling capacitors, each having a first terminal and a second terminal;
a first set of switches configured to connect reference voltage nodes with the first terminals of the first and second sampling capacitors during reference sampling phases of the integrator; and
a second set of switches configured, during integration phases of the integrator, to connect:
the second terminals of the first and second sampling capacitors with the first and second input nodes of the amplifier; and
the first terminals of the first and second sampling capacitors with outputs of first and second sampling networks, wherein the first set of switches is open during the integration phases, wherein the second set of switches is open during the reference sampling phases, and wherein each of the first and second sampling networks comprises:
a first input capacitor having first and second terminals;
a second input capacitor having first and second terminals;
a third set of switches configured to selectively connect an input node of the sampling network with the first terminal of the first input capacitor;
a fourth set of switches configured to connect an output node of the sampling network with the second terminal of the second input capacitor during a first set of the integration phases;
a fifth set of switches configured to selectively connect the input node of the sampling network with the first terminal of the second input capacitor; and
a sixth set of switches configured to connect the output node of the sampling network with the second terminal of the first input capacitor during a second set of the integration phases.

20. The integrator of claim 19, wherein:
the first set of the integration phases comprises odd integration phases;
the second set of the integration phases comprises even integration phases; and
the reference sampling phases overlap neither the first nor the second set of the integration phases.

21. The integrator of claim 19, wherein:
the third set of switches is configured to connect the input node of the sampling network with the first terminal of the first input capacitor during the first set of the integration phases; and
the fifth set of switches is configured to connect the input node of the sampling network with the first terminal of the second input capacitor during the second set of the integration phases.

22. The integrator of claim 19, wherein:
the third set of switches is further configured to selectively connect the second terminal of the first input capacitor to a first voltage level; and
the fourth set of switches is further configured to selectively connect the first terminal of the second input capacitor to a second voltage level.

23. The integrator of claim 22, wherein:
the fifth set of switches is further configured to selectively connect the second terminal of the second input capacitor to the first voltage level; and
the sixth set of switches is further configured to selectively connect the first terminal of the first input capacitor to the second voltage level.

24. The integrator of claim 19, wherein during the integration phases, the first sampling capacitor is effectively connected in series with the first or the second input capacitor in the first sampling network and the second sampling capacitor is effectively connected in series with the first or the second input capacitor in the second sampling network.

25. The integrator of claim 19, wherein the third and fourth sets of switches are open during the second set of the integration phases and wherein the fifth and sixth sets of switches are open during the first set of the integration phases.

26. The integrator of claim 25, wherein:
the third set of switches is closed and the sixth set of switches is open during a first set of input sampling phases; and
the fifth set of switches is closed and the fourth set of switches is open during a second set of input sampling phases, different from the first set of input sampling phases.

27. The integrator of claim 19, further comprising an anti-aliasing filter connected between input voltage nodes and the input nodes of the first and second sampling networks.

28. The integrator of claim 19, wherein:
the reference voltage nodes comprise a positive reference voltage node and a negative reference voltage node; and
the first set of switches is configured to connect:
the positive reference voltage node with the first terminal of the first sampling capacitor;
the negative reference voltage node with the first terminal of the second sampling capacitor; and
the second terminals of the first and second sampling capacitors with a voltage level.

29. The integrator of claim 28, wherein:
in a first configuration, the second set of switches is configured to connect:
the output node of the first sampling network with the first terminal of the first sampling capacitor;
the output node of the second sampling network with the first terminal of the second sampling capacitor;
the first input node of the amplifier with the second terminal of the first sampling capacitor; and
the second input node of the amplifier with the second terminal of the second sampling capacitor; and
in a second configuration, the second set of switches is configured to connect:
the output node of the first sampling network with the first terminal of the second sampling capacitor;
the output node of the second sampling network with the first terminal of the first sampling capacitor;
the first input node of the amplifier with the second terminal of the second sampling capacitor; and
the second input node of the amplifier with the second terminal of the first sampling capacitor.

30. The integrator of claim 29, wherein selection between the first and second configurations is controlled by a digital input to a digital-to-analog converter (DAC) in a delta-sigma modulator comprising the integrator.

31. The integrator of claim 19, wherein:
the second set of switches has a first configuration and a second configuration; and
selection between the first and second configurations is controlled by a digital input to a digital-to-analog converter (DAC) in a delta-sigma modulator comprising the integrator.

* * * * *